US005245244A

United States Patent [19]

Takahashi et al.

[11] Patent Number: 5,245,244

[45] Date of Patent: Sep. 14, 1993

[54] PIEZOELECTRIC INK DROPLET EJECTING DEVICE

[75] Inventors: Yoshikazu Takahashi, Kasugai; Masahiko Suzuki, Nagoya; Shigeru Kagayama, Owariasahi, all of Japan

[73] Assignee: Brother Kogyo Kabushiki Kaisha, Aichi, Japan

[21] Appl. No.: 852,542

[22] Filed: Mar. 17, 1992

[30] Foreign Application Priority Data

Mar. 19, 1991 [JP] Japan .................................. 3-54669
Aug. 27, 1991 [JP] Japan .................................. 3-215461
Aug. 27, 1991 [JP] Japan .................................. 3-215462

[51] Int. Cl.[5] ...................... H01L 41/04; G01D 15/16

[52] U.S. Cl. ................................ 310/328; 346/140 R; 310/333

[58] Field of Search ............... 310/311, 328, 333, 342, 310/348, 367, 368, 371; 346/140 PD

[56] References Cited

U.S. PATENT DOCUMENTS 4,599,628 7/1986 Doring et al. .
4,879,568 11/1989 Bartky et al. .
4,887,100 12/1989 Michaelis et al. .
4,929,256 5/1990 Shepherd .
4,940,996 7/1990 Paton et al. .
4,942,409 7/1990 Paton et al. .
4,973,981 11/1990 Bartky et al. .
4,992,808 2/1991 Bartky et al. .
5,003,679 4/1991 Bartky et al. .
5,016,028 5/1991 Temple ........................ 346/140 PD
5,028,936 7/1991 Bartky et al. .

FOREIGN PATENT DOCUMENTS 0095911 12/1983 European Pat. Off. .
0145066 6/1985 European Pat. Off. .
0156268 9/1982 Japan ........................... 316/140 PD
63-247051 10/1988 Japan .
63-252750 10/1988 Japan .
1-140970 6/1989 Japan .
1-226338 7/1989 Japan .
2-11330 1/1990 Japan .
2-11333 1/1990 Japan .
2-265750 10/1990 Japan .

*Primary Examiner*—Steven L. Stephan
*Assistant Examiner*—Ed To
*Attorney, Agent, or Firm*—Oliff & Berridge

[57] ABSTRACT

A piezoelectric ink droplet ejecting device drivable with a low voltage, simple in structure, less costly to manufacture and capable of producing printed data with high resolution. A piezoelectric ink droplet ejecting device has a plurality of ink ejectors each composed of a piezoelectric transducer for varying the volume of an ink passage to eject ink out of the ink passage. A single piezoelectric ceramic panel which is polarized in a thickness direction has a plurality of through holes parallel to the polarized direction. The through holes serve as ink passages. When a driving electric field is applied in a direction perpendicular to the polarized direction, the piezoelectric ceramic panel is elastically deformed under thickness shear effect, thus varying the volume of the ink passages to eject ink droplets therefrom.

17 Claims, 13 Drawing Sheets

PIEZOELECTRIC INK DROPLET EJECTING DEVICE

BACKGROUND OF THE INVENTION

The present invention relates to a piezoelectric ink droplet ejecting device, and more particularly to a piezoelectric ink droplet ejecting device operable based on the elastic deformation of a piezoelectric transducer.

There have recently been proposed an ink jet printer having a printer head for printing with a piezoelectrically propelled ink jet. When a piezoelectric actuator varies its dimensions, the volume of an ink passage is varied. When the volume of the ink passage is reduced, ink contained in the ink passage is ejected out of an orifice, and when the volume of the ink passage is increased, ink is introduced from a valve into the ink passage. The printer head with such an ink ejector is known as a printer head of the drop-on-demand type. A plurality of such ink ejectors are closely put together, and ink is ejected from desired ink ejectors to form a desired character or image.

With the conventional piezoelectric ink droplet ejecting device, however, each of the ink ejectors includes a single piezoelectric actuator. In the case where a number of ink ejectors are closely arranged for printing a wide range of desired data with high resolution, the overall structure is complex, manufactured in a large number of steps, and expensive to manufacture.

SUMMARY OF THE INVENTION

In view of the aforesaid drawbacks of the conventional piezoelectric ink droplet ejecting device, it is an object of the present invention to provide a piezoelectric ink droplet ejecting device which is simple in structure, less costly to manufacture, and can produce printed data with high resolution.

This and other objects of the present invention will be attained by providing a piezoelectric ink droplet ejecting device having a plurality of ink ejectors each composed of a piezoelectric transducer for varying a volume of an ink passage to eject ink out of the ink passage, the device comprising the piezoelectric transducer made of a piezoelectric material and polarized in one direction. The piezoelectric transducer is formed with a plurality of the ink passages extending therethrough in a direction parallel to the polarized direction. The piezoelectric transducer is elastically deformable to vary the volume of the ink passages to eject ink stored therein in response to a drive electric field applied perpendicularly to the polarized direction in each of the ink passages.

The piezoelectric material disposed around an ink passage corresponding to any one of the ink ejectors is elastically deformable under thickness shear effect in the transverse direction thereof for ejecting ink in the ink passage from the ink ejector.

BRIEF DESCRIPTION OF THE DRAWINGS

In the drawings;

FIG. 9(*b*) is a transverse cross-sectional view taken along line IX—IX of FIG. 9(*a*);

FIG. 10(*b*) is a transverse cross-sectional view taken along line X—X of FIG. 10(*a*);

FIG. 11(*b*) is a plan view showing a deformation of a side ends fixed wall in the thickness shear effect mode;

FIG. 12(*b*) is a transverse cross-sectional view taken along line XII—XII of FIG. 12(*a*);

FIG. 13(*b*) is a transverse cross-sectional view taken along line XIII—XIII of FIG. 13(*a*);

FIG. 14(*b*) is a cross-sectional view taken along line XIV—XIV of FIG. 14(*a*);

FIG. 15(*b*) is an exploded perspective view showing the manner in which the array according to the first embodiment is assembled;

FIG. 16(*b*) is an exploded perspective view showing the manner in which the array according to the second embodiment is assembled;

FIG. 17(*b*) is an exploded perspective view showing the manner in which the array according to the third embodiment is assembled.

DETAILED DESCRIPTION OF THE PREFERRED EMBODIMENTS

Figure 1:
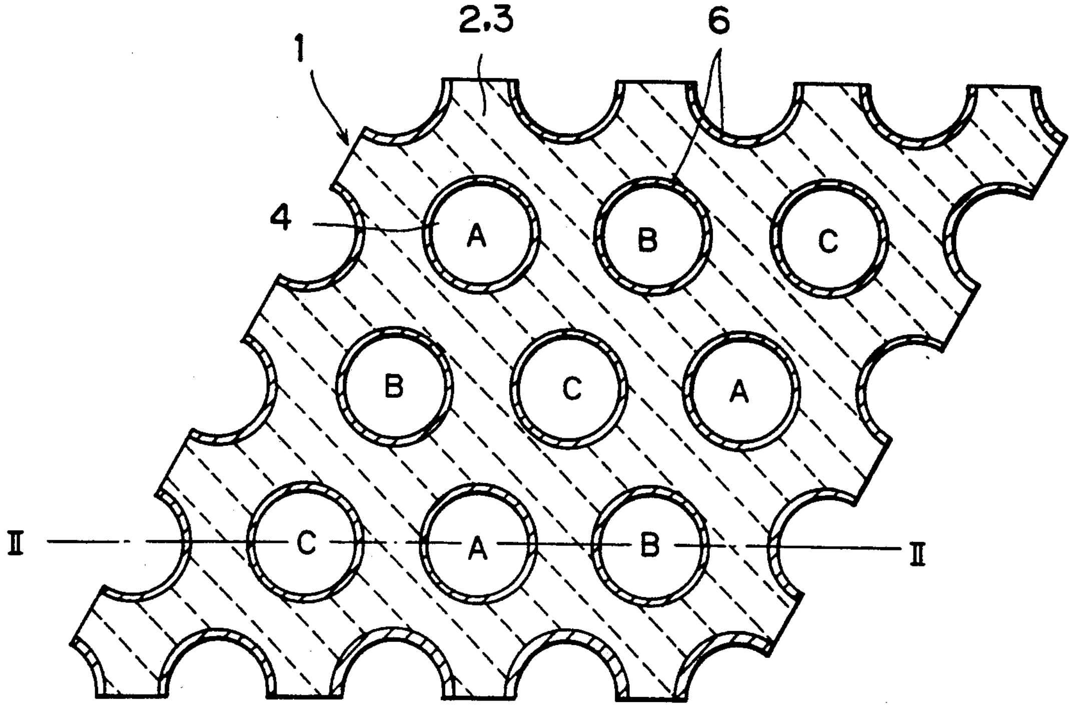
FIG. 1 is a cross-sectional view showing an array of a piezoelectric ink droplet ejecting devices.

A piezoelectric ink droplet ejecting device according to a first embodiment of the present invention will hereinafter be described in detail with reference to FIGS. 1 through 8. Firstly, FIG. 8 fragmentarily shows an ink jet printer incorporating the piezoelectric ink droplet ejecting device according to the first embodiment of the invention. A platen 36 for supporting a sheet of paper 58 is rotatably mounted on a frame 40 by a shaft 38, and can be driven to rotate about its own axis by a motor 42. A piezoelectric ink droplet ejecting device 44 is disposed in confronting relationship to the platen 36. The piezoelectric ink droplet ejecting device 44 is mounted, together with an ink supply unit 46, on a carriage 48. The carriage 48 is slidably supported on two guide rods 50 extending parallel to the axis of the platen 36, and is coupled to a timing belt 56 that is trained around a pair of pulleys 52. One of the pulleys 52 can be rotated by a motor 54 for moving the timing belt 56 thereby to move the carriage 48 along the platen 36.

Figure 2:
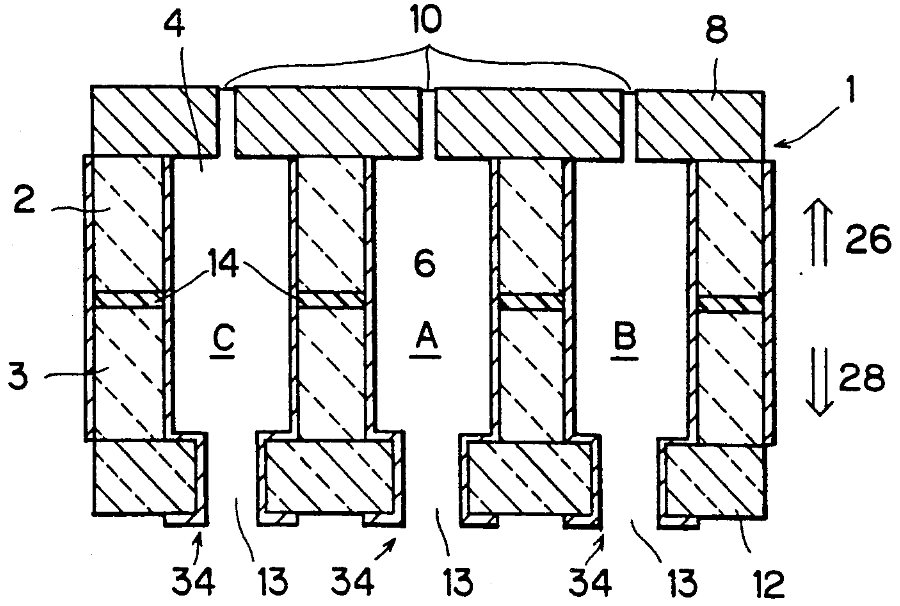
FIG. 2 is a transverse cross-sectional view taken along line II—II of FIG. 1.

FIG. 1 shows in cross-section an array 1 in the piezoelectric ink droplet ejecting device 44. FIG. 2 is a cross-sectional view taken along line II—II of FIG. 1, showing the array 1. The array 1 includes an upper piezoelectric ceramic panel 2 and a lower piezoelectric ceramic panel 3. The upper piezoelectric ceramic panel 2 is polarized in the direction indicated by the arrow 26 and has a thickness of 1.25 mm. The upper piezoelectric ceramic panel 2 is formed with through holes each having a diameter of 0.5 mm which have respective centers spaced by a distance of 0.75 mm. The through holes are arranged in a geometric pattern having symmetric hexad axes (having 6 rotational symmetry ($2\pi/n$; $n=6$).

The lower piezoelectric ceramic panel 3 is also polarized in the direction indicated by an arrow 28. The panel 3 is formed with through holes each having a diameter of 0.5 mm which have respective centers spaced by a distance of 0.75 mm and are arranged in a geometric pattern having symmetric hexad axes. The lower piezoelectric ceramic panel 3 has a thickness of 1.25 mm. The upper and lower piezoelectric ceramic panels 2, 3 are bonded to each other by an adhesive layer 14 interposed therebetween. The through holes serve as ink passages 4 each having a circular cross-section of a diameter of 0.5 mm and a length of 2.5 mm.

The ink passages are divided by walls of the piezoelectric ceramic panels 2, 3. Each wall has a minimum transverse width of 0.25 mm. The inner wall surfaces of all the ink passages 4 are lined with electrodes 6 whose surfaces are coated with insulating films for insulation from ink.

An orifice plate 8 having orifices 10 communicating respectively with the ink passages 4 is joined to the upper surface of the upper piezoelectric ceramic panel 2. A bottom plate 12 having ink supply passages 13 connected to the ink supply unit 46 and communicating respectively with the ink passages 4 is joined to the lower surface of the lower piezoelectric ceramic panel 3. An ink ejector 34 thus comprises one orifice 10 for ejecting ink droplets, one ink passage 4, one ink supply passage 13, and the piezoelectric ceramic panels 2, 3 for varying the volume of the ink passage to apply a pressure to ink contained therein. The array 1 of the piezoelectric ink droplet ejecting device 44 has nine (9) ink ejectors 34 as best shown in FIG. 1.

Figure 4:
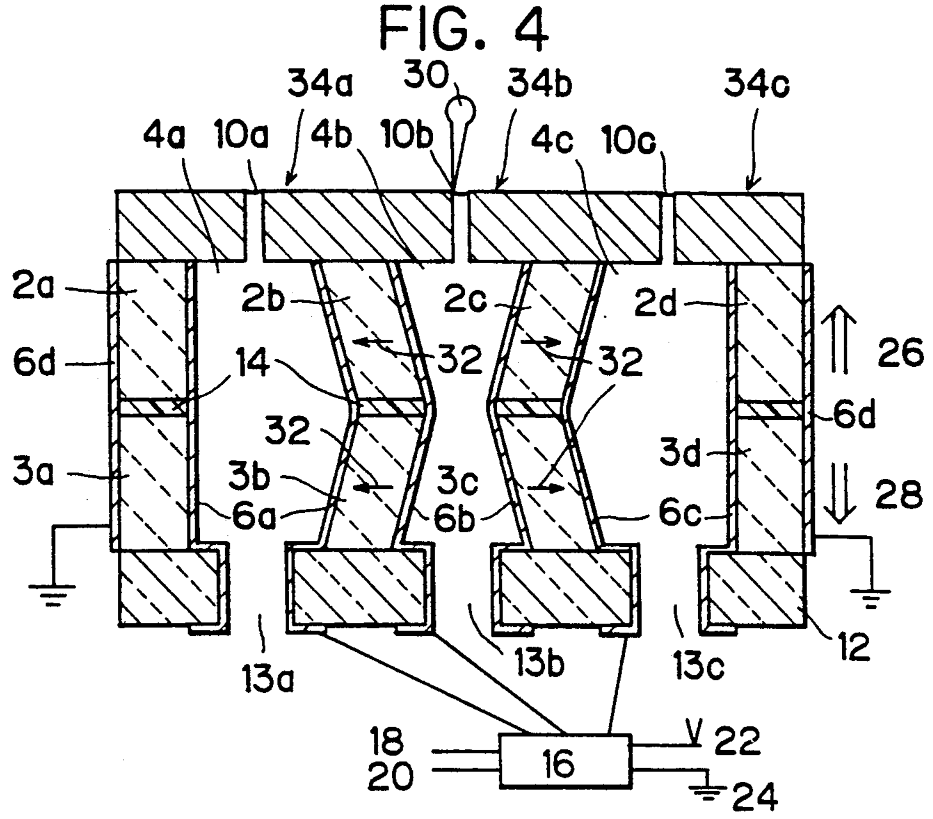
FIG. 4 is a transverse cross-sectional view taken along line IV—IV of FIG. 3.

The array 1 has an electric circuit as shown in FIG. 4. In this electric circuit, all electrodes 6*d* on the inner surfaces of those through holes 5 which are positioned at the edges of the array 1 and hence unable to provide ink passages 4, are connected to a ground. Electrodes 6*a* through 6*c* are connected to the driver LSI chip 16, to which there are also connected a clock line 18, a data line 20, a voltage line 22, and a ground line 24.

The ink passages 4 are divided into groups A, B, C which are positioned adjacent to each other, as shown in FIG. 1. Successive clock pulses supplied from the clock line 18 are applied to successively drive the ink passage groups A, B, C. Data in the form of a multibit word transmitted over the data line 20 selects a group of ink passages 4 and one of the ink passages 4 of the selected group, which is to be actuated, and a voltage V on the voltage line 22 is applied to the electrode 6 in the selected ink passage 4. At this time, the electrodes 6 in the other ink passages 4 of the same selected group and the electrodes 6 in the ink passages 4 of the other groups are grounded. Therefore, an electric field is applied between the electrode in the selected ink passage 4 and the electrodes in the six (6) adjacent ink passages 4 in directions normal to the polarized directions of the piezoelectric ceramic panels 2, 3. The walls of the piezoelectric ceramic panels 2, 3, which define the ink passages between which the electric field is applied, are elastically deformed under the thickness shear effect in the transverse direction, thereby varying the volume of the selected ink passage 4. In this manner, all the ink passages 4 of the groups can be actuated.

Figure 3:
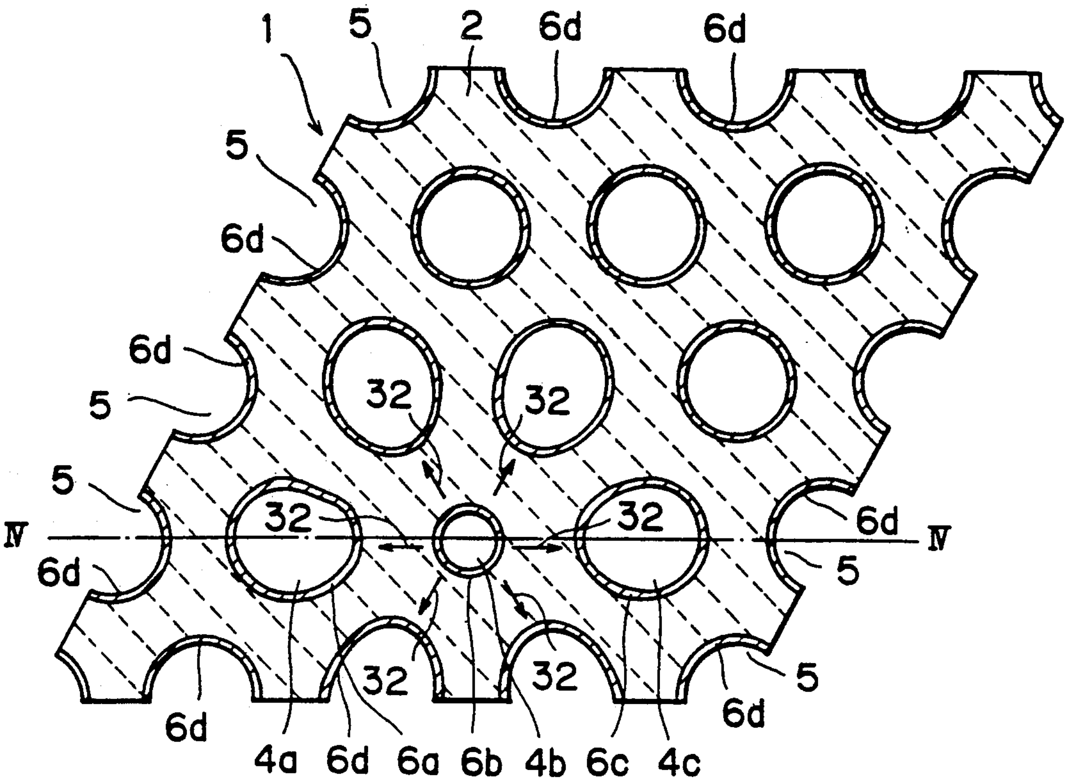
FIG. 3 is a view showing the array with an electric circuit connected thereto.

FIGS. 3 and 4 show an instance in which an ink ejector 34*b* is selected according to given print data. FIG. 4 is a cross-sectional view taken along line IV—IV of FIG. 3. A voltage V from the voltage line 22 is applied to an electrode 6*b* in an ink passage 4*b*, and all other electrodes 6 including electrodes 6*a*, 6*c* in those ink passages which are positioned adjacent to the ink passage 4*b* are grounded. In response to the applied voltage V, a driving electric field is applied in the directions indicated by the arrows 32 to all walls of the piezoelectric ceramic panels 2, 3, including walls 2*b*, 3*b*, 2*c*, 3*c*, which surround the ink passage 4*b*.

Since the driving electric field is directed perpendicularly to the polarized directions, all walls of the piezoelectric ceramic panels 2, 3, including walls 2*b*, 3*b*, 2*c*, 3*c*, which surround the ink passage 4*b* are elastically deformed under thickness shear effect into the cross-sectional shape of a chevron toward the ink passage 4*b*. Therefore, the volume of the ink passage 4*b* is reduced, ejecting ink 30 out through an orifice 10*b*. When the application of the voltage is cut off, all walls of the piezoelectric ceramic panels 2, 3, including walls 2*b*, 3*b*, 2*c*, 3*c*, which surround the ink passage 4*b* return to their original positions. At this time, the volume of the ink passage 4*b* is increased, and the ink passage 4*b* is supplied with ink from the ink supply unit 46 through the ink supply passage 13*b*.

Likewise, when another ink ejector 34*c* is selected, all walls of the piezoelectric ceramic panels 2, 3, including walls 2*c*, 3*c*, 2*d*, 3*d*, which surround an ink passage 4*c* are elastically deformed under thickness shear effect into the cross-sectional shape of a chevron toward the ink passage 4*c*, which then ejects ink therefrom.

With the piezoelectric ink droplet ejecting device according to the present invention, a piezoelectric transducer for actuating the nine ink ejectors 34 is composed of two piezoelectric ceramic panels 2, 3, with a resultant simplified structure for the array 1. The piezoelectric ink droplet ejecting device can be manufactured in a relatively small number of steps and with a relatively low cost by employing the array 1 or a combination of arrays 1. It is possible to increase the number of ink ejectors 34, reduce the size of the array 1, and increase the resolution of printed data by using a number of closely positioned through holes or ink passages 4 in the piezoelectric ceramic panels 2, 3. For example, an array 1 can have ninety-six (96) ink passages 4, which are of the same dimensions and spaced at the same center-to-center distance as those of the illustrated embodiment, in a matrix of 8 (vertical)×12 (horizontal). Such array has outer dimensions of 10 mm×6 mm×5 mm or less.

Figure 5:
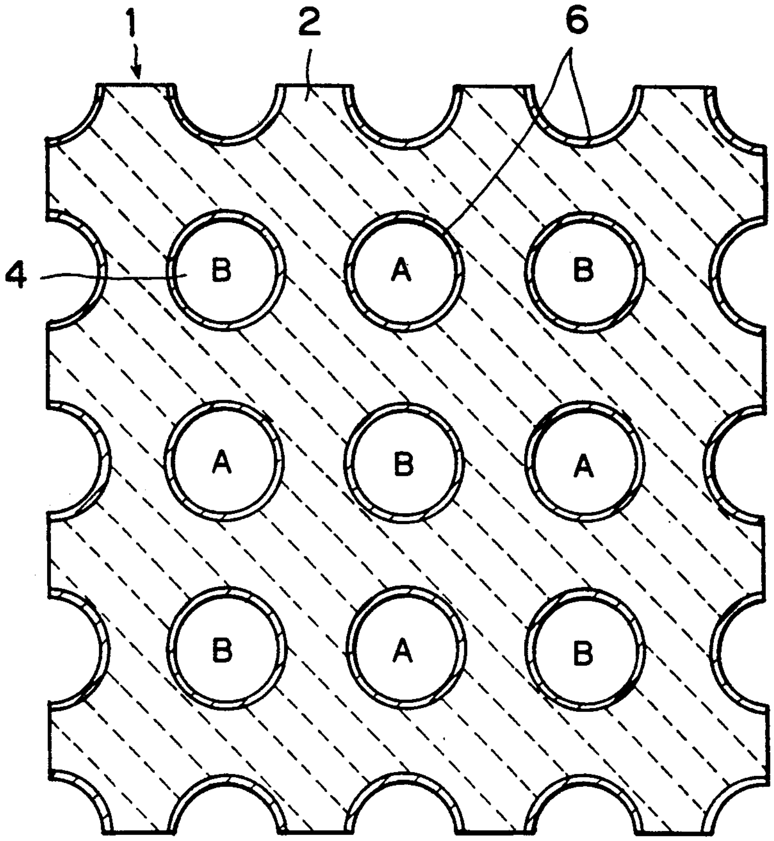
FIG. 5 is a cross-sectional view showing an array of a piezoelectric ink droplet ejecting devices according to one modification to the first embodiment of the present invention.

Various modifications may be effected to the first embodiment described above. For example, the ink passages 4 may not necessarily be arranged in a geometric pattern having symmetric hexad axes, but may be in any one of geometric patterns having symmetric diad, triad, tetrad axes, for example. As one typical modification, in a geometric pattern having symmetric tetrad axes shown in FIG. 5, the ink passages 4 are divided into two groups A, B, and the driver circuit for their electrodes may be of a simpler design.

Figure 6:
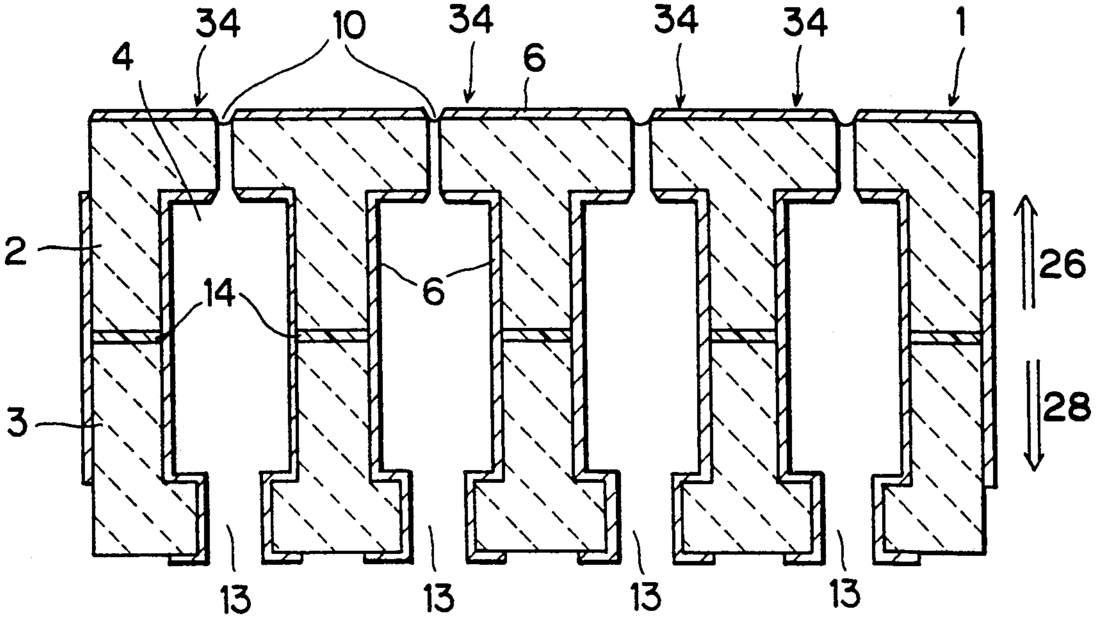
FIG. 6 is a transverse cross-sectional view showing, an array of a piezoelectric ink droplet ejecting devices according to another modification to the first embodiment of the present invention.

Further, the through holes serving as ink passages may not necessarily be of a uniform inside diameter, but each of them may have different-diameter portions including smaller-diameter portions as an orifice 10 and an ink supply passage 13 and a larger-diameter portion as an ink passage 4, as shown in FIG. 6. Such a modification is effective to reduce the number of parts used. Further, electrodes 6 can also be formed on the top and bottom surfaces of the ink passages 4 in the piezoelectric ceramic panels 2, 3 as shown in FIG. 6. In this case, the electrodes can be energized with a lower voltage, since a thickness expansion effect also occurs at the top and bottom portions of the ink passage 4 in addition to the thickness shear effect.

Figure 7:
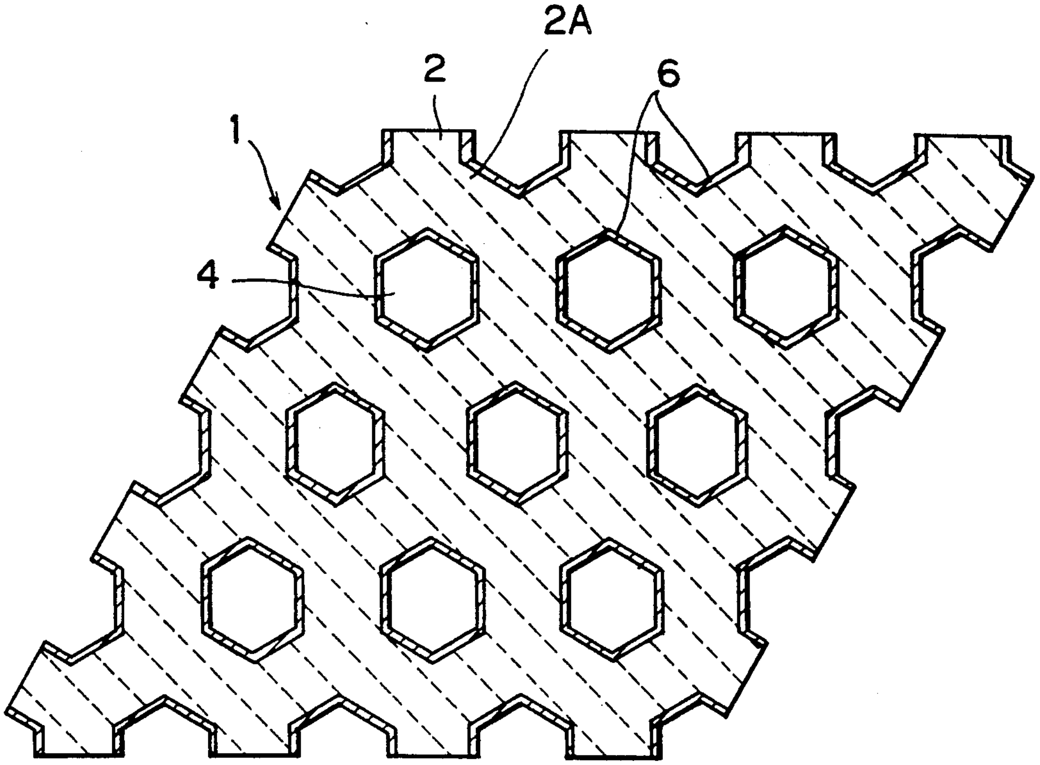
FIG. 7 is a cross-sectional view showing an array of a piezoelectric ink droplet ejecting devices according to still another modification to the first embodiment of the present invention.
Figure 8:
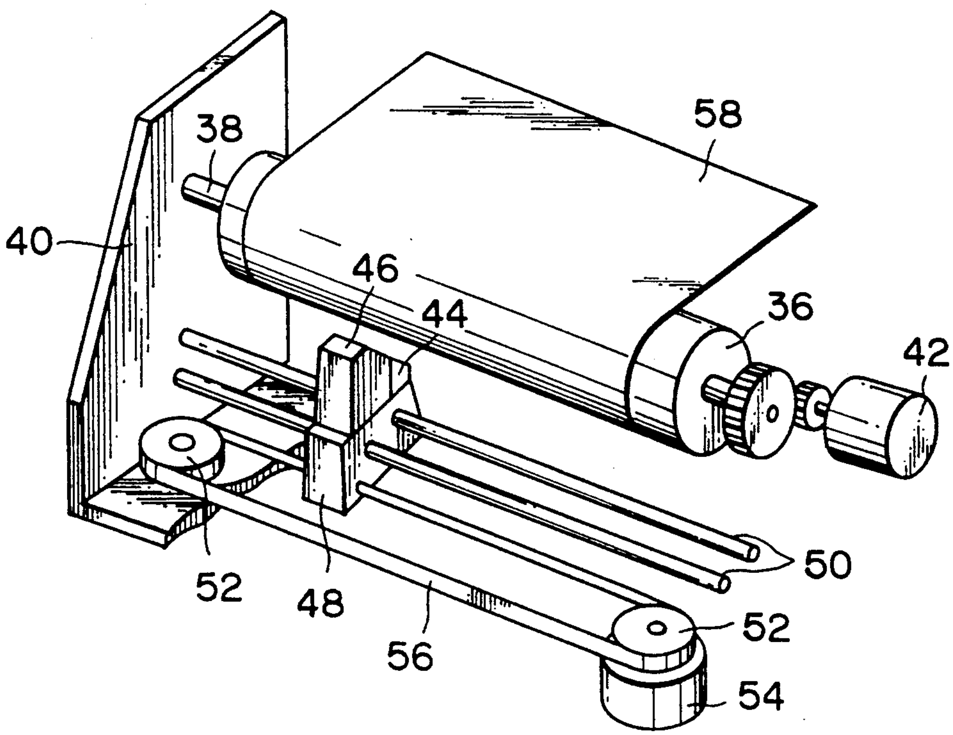
FIG. 8 is a fragmentary perspective view showing an ink jet printer which incorporates a piezoelectric ink droplet ejecting device.

The ink passages 4 may not be of a circular cross-section, but may have an elliptical or polygonal cross section. In the case where ink passages 4 are of a hexagonal cross-section, as shown in FIG. 7, the walls 2A of the piezoelectric ceramic panels 2, 3 which surround the ink passages 4 are of a uniform thickness. Thus, an ideal electric field distribution can be developed in the walls 2A of a uniform thickness, so that the electrodes can be actuated with a lower voltage.

As described above, the piezoelectric ink droplet ejecting device according to the first embodiment of the invention is simpler in structure and can be manufactured in a smaller number of steps than the conventional piezoelectric ink droplet ejecting device. Therefore, the ejecting device can be manufactured inexpensively. Since it is easy to pack a large number of ink passages in a small region, the piezoelectric ink droplet ejecting device can be reduced in size and can print data with increased resolution.

A piezoelectric ink droplet electing device according to a second embodiment of the present invention will next be described with reference to FIGS. 9(*a*) through 11(*b*). The second embodiment pertains to an improvement on the first embodiment. That is, the first embodiment described above may have a problem in that the required drive voltage varies depending on the configuration of the side walls of ink passages in the piezoelectric ceramic. For example, with the arrangement shown in FIG. 7, when six side walls 2A are actuated and elastically deformed into a common ink passage 4, the joints between the adjacent side walls 2A (at the vertexes of the regular hexagonal cross-sectional shape of the ink passage 4) are essentially not deformed into the ink passage 4, but remain fixed in position. Therefore, a high drive voltage may be required to elastically deform the side walls 2A under thickness shear effect in the transverse direction.

This problem may be solved by increasing the distances between the fixed joints, i.e., by elongating the side walls in a direction perpendicular to the longitudinal direction of the ink passages. However, such a solution is disadvantageous in that the distance between adjacent orifices is increased, resulting in a reduction in printing resolution, and the side walls have reduced mechanical strength which leads to lowering of reliability in the ink droplet ejecting device. The second embodiment is provided in view of the foregoing standpoints.

Figure 9A:
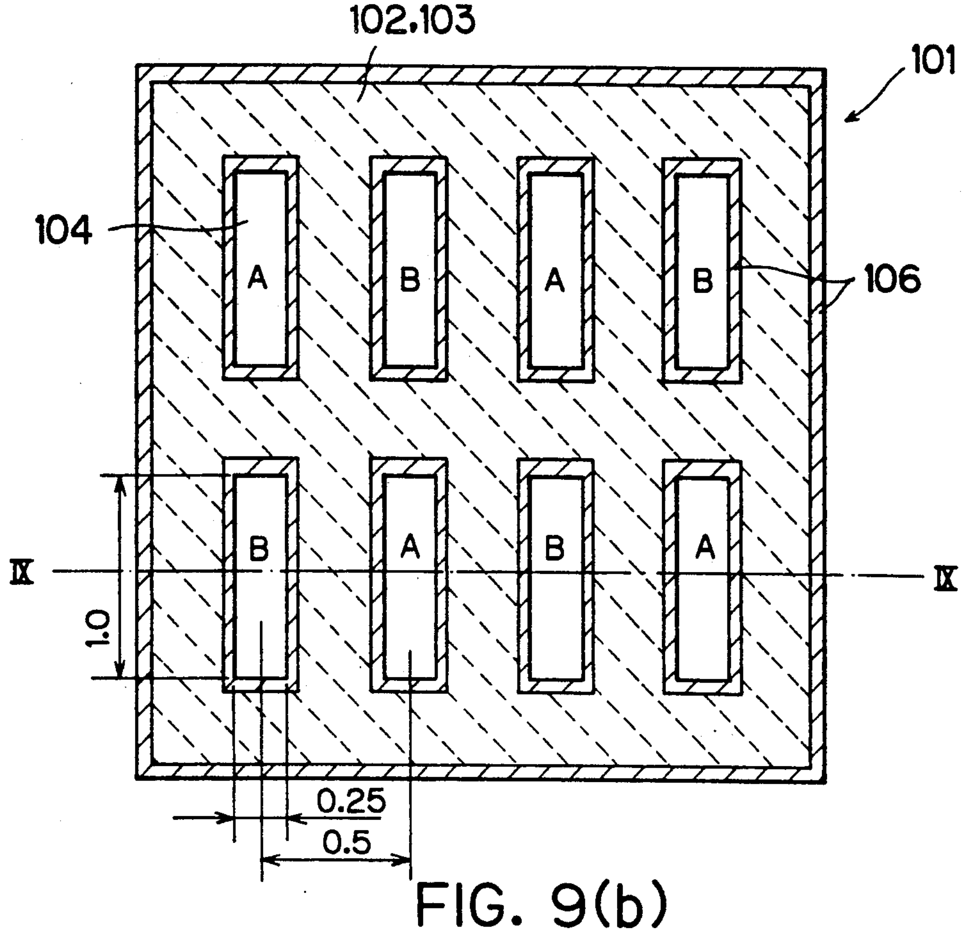
FIG. 9(*a*) is a cross-sectional view showing an array for use in a piezoelectric ink droplet ejecting device according to a second embodiment of this invention.
Figure 9B:
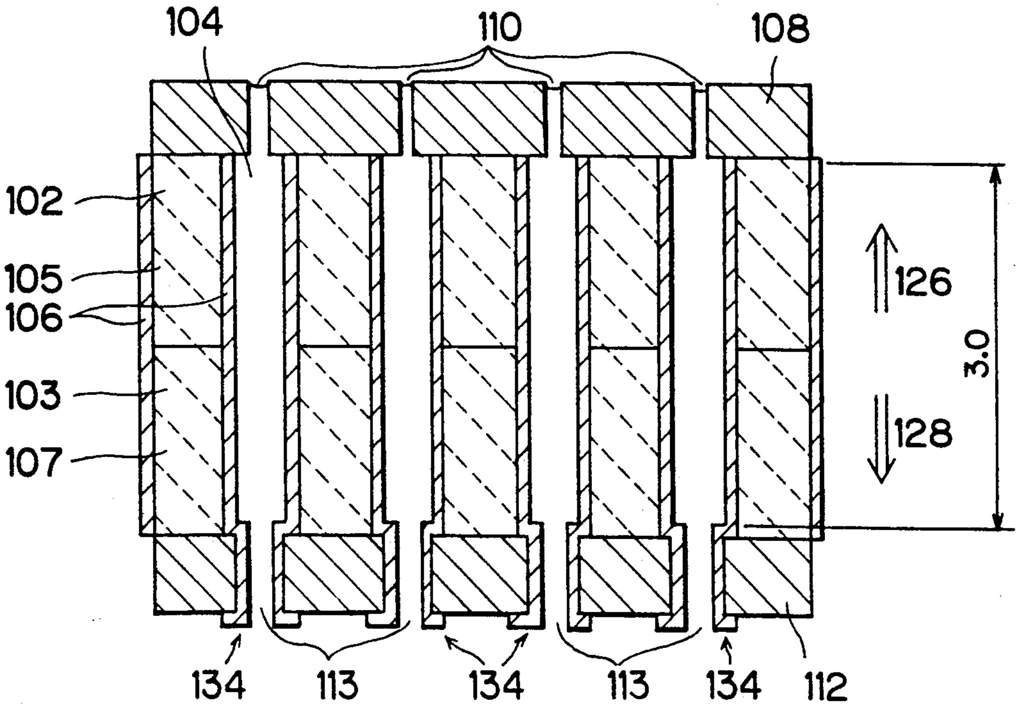

As shown in FIGS. 9(*a*) and 9(*b*), an array 101 includes an upper piezoelectric ceramic panel 102 polarized in the direction indicated by an arrow 126 and having through holes which are of a rectangular cross section having a vertical dimension of 1.0 mm and a horizontal dimension of 0.25 mm and which have respective centers spaced by a distance of 0.5 mm. The through holes are arranged in a matrix of 2 horizontal rows×4 vertical columns. The upper piezoelectric ceramic panel 102 has a thickness of 1.5 mm. The array 101 also includes a lower piezoelectric ceramic panel 103 polarized in the direction indicated by an arrow 28 and having through holes which are of a rectangular cross section having a vertical dimension of 1.0 mm and a horizontal dimension of 0.25 mm and which have respective centers spaced by a distance of 0.5 mm. The through holes are arranged in a matrix of 2 horizontal rows×4 vertical columns. The lower piezoelectric ceramic panel 103 has a thickness of 1.5 mm. The upper and lower piezoelectric ceramic panels 102, 103 are bonded to each other. The through holes serve as ink passages 104, respectively, each having a length of 3.0 mm. The piezoelectric ceramic panels 102, 103 have side walls 105, 107 which divide the ink passages 104. Each of the side walls 105, 107 has a horizontal dimension of 0.25 mm.

Similar to the first embodiment, inner wall surfaces of all the ink passages 104 are lined with electrodes 106 whose surfaces are coated with insulating films for insulation from ink. An orifice plate 108 having orifices 110 communicating respectively with the ink passages 104 is joined to the upper surface of the upper piezoelectric ceramic panel 102. A bottom plate 112 having ink supply passages 113 connected to an ink supply unit and communicating respectively with the ink passages 104 is joined to the lower surface of the lower piezoelectric ceramic panel 103. An ink ejector 134 thus comprises one orifice 110 for ejecting ink droplets, one ink passage 104, one ink supply passage 113, and the piezoelectric ceramic panels 102, 103 for varying the volume of the ink passage to apply a pressure to ink contained therein. The array 101 of the piezoelectric ink droplet ejecting device has eight (8) ink ejectors 134 as best shown in FIG. 9(*a*).

Figure 10A:
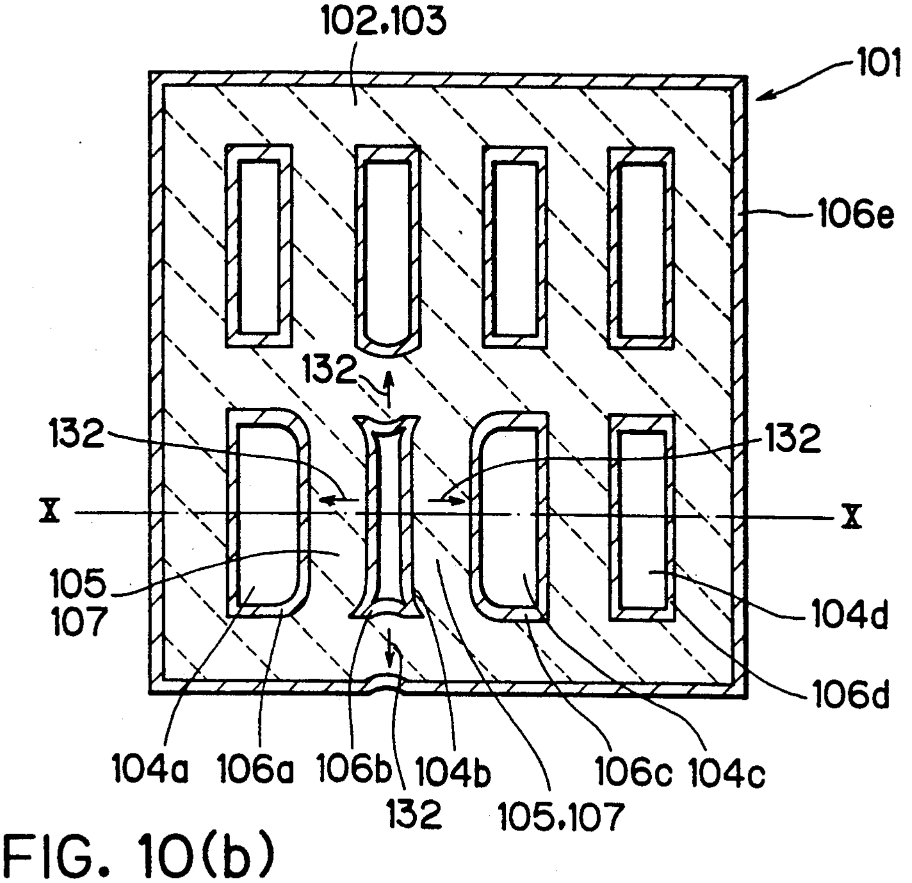
FIG. 10(*a*) is a view showing the array with an electric circuit connected thereto according to the second embodiment of this invention.
Figure 10B:
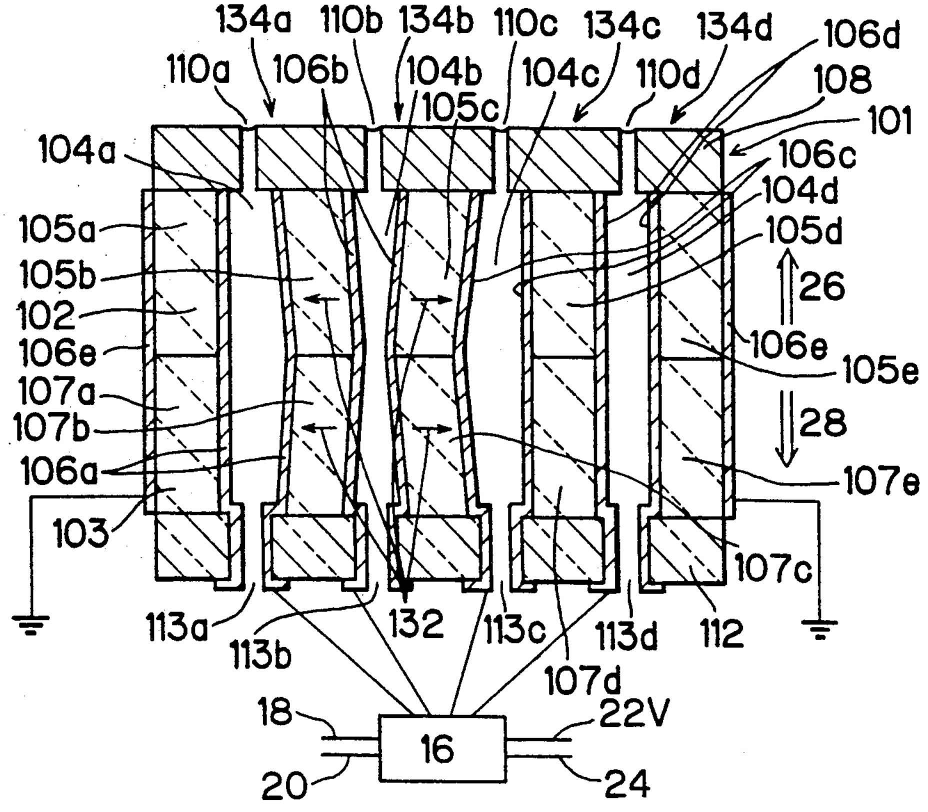

The array 101 has an electric circuit as shown in FIG. 10(*b*). In this electric circuit, all electrodes 106*e* at the edges of the array 101 are connected to a ground. Electrodes 106*a* through 106*d* are connected to the driver LSI chip 16, to which there are also connected a clock line 18, a data line 20, a voltage line 22, and a ground line 24 similar to the first embodiment.

The ink passages 104 are divided into two groups A, B which are not positioned adjacent to each other, as shown in FIG. 9(*a*). Successive clock pulses supplied from the clock line 18 are applied to successively drive the ink passage groups A, B. Data in the form of a multibit word transmitted over the data line 20 selects a group of ink passages 104 and one of the ink passages 104 of the selected group, which is to be actuated, and a voltage V on the voltage line 22 is applied to the electrode 106 in the selected ink passage 104. At this time, the electrodes 106 in the other ink passages 104 of the same selected group and the electrodes 6 in the ink passages 4 of the other groups are grounded. Therefore, an electric field is applied between the electrode in the selected ink passage 104 and the electrodes in the three (3) adjacent ink passages 104 in directions normal to the polarized directions of the piezoelectric ceramic panels 102, 103. The walls of the piezoelectric ceramic panels 102, 103, which define the ink passages between which the electric field is applied, are elastically deformed under the thickness shear effect in the transverse direction, thereby varying the volume of the selected ink passage 104. In this manner, all the ink passages 104 of the groups can be actuated.

FIGS. 10(*a*) and 10(*b*) show an instance in which an ink ejector 134*b* is selected according to given print data. A voltage V from the voltage line 22 is applied to an electrode 106*b* in an ink passage 104*b*, and all other electrodes 106 including electrodes 106*a*, 106*c* in those ink passages which are positioned adjacent to the ink passage 104*b* are grounded. In response to the applied voltage V, a driving electric field is applied in the directions indicated by the arrows 132 to all walls of the piezoelectric ceramic panels 102, 103, including walls 105*b*, 107*b*, 105*c*, 107*c* which surround the ink passage 104*b*.

Since the driving electric field is directed perpendicularly to the polarized directions, all walls of the piezoelectric ceramic panels 102, 103, including walls 105*b*, 107*b*, 105*c*, 107*c*, which surround the ink passage 104*b* are elastically deformed under thickness shear effect into the cross-sectional shape of a chevron toward the ink passage 104*b*. Therefore, the volume of the ink passage 104*b* is reduced, ejecting ink out through an orifice 110*b*. When the application of the voltage is cut off, all walls of the piezoelectric ceramic panels 102, 103, including walls 105*b*, 107*b*, 105*c*, 107*c*, which surround the ink passage 104*b* return to their original positions. At this time, the volume of the ink passage 104*b* is increased, and the ink passage 104*b* is supplied with ink from the ink supply unit through the ink supply passage 113*b*.

Likewise, when another ink ejector 134*c* is selected, all walls of the piezoelectric ceramic panels 2, 3, including walls 105*c*, 107*c*, 105*d*, 107*d*, which surround an ink passage 104*c* are elastically deformed under thickness shear effect into the cross-sectional shape of a chevron toward the ink passage 104*c*, which then ejects ink therefrom.

Elastic deformation under shearing effect will be described below with reference to FIGS. 11(*a*) and 11(*b*).

Figure 11A:
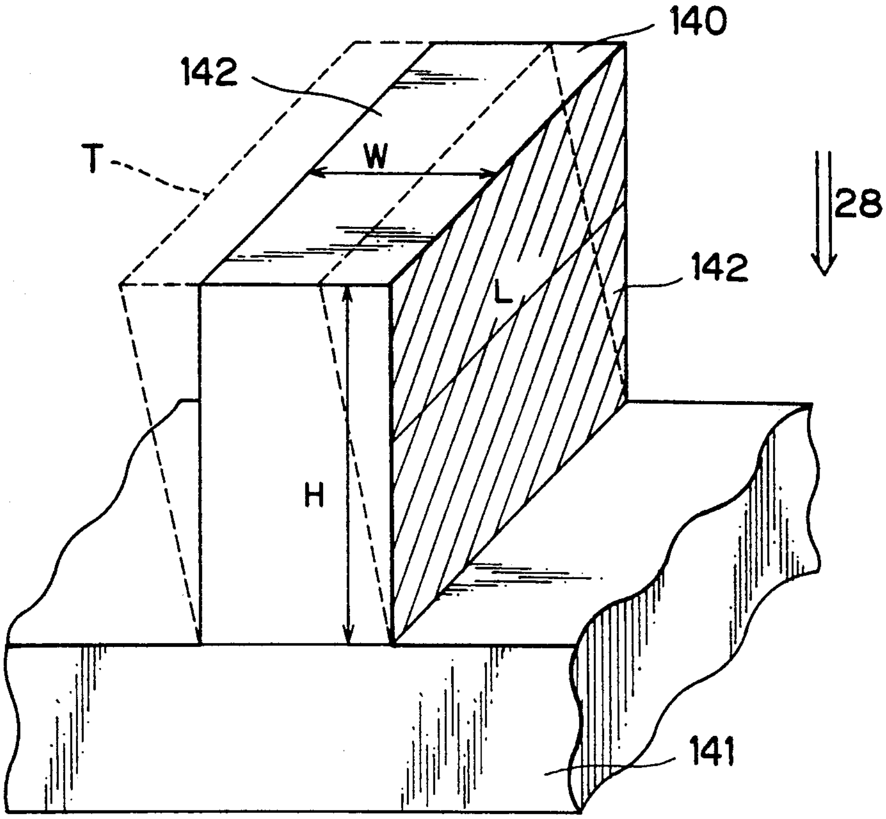
FIG. 11(*a*) is a perspective view showing a deformation of a wall because of thickness shear effect mode.
Figure 11B:
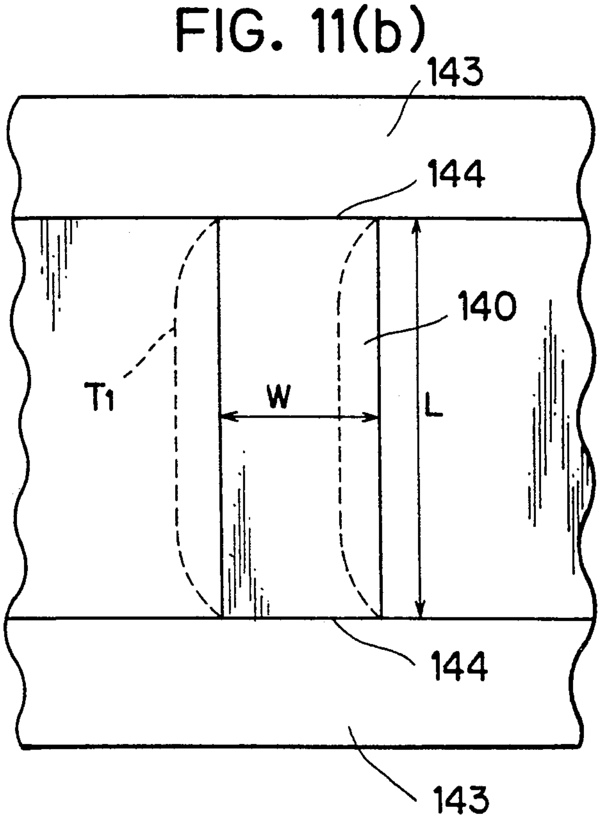

FIG. 11(*a*) is a perspective view of a wall 140 fixed to a base board 141. The wall 140 has a height H in the polarized direction 28, a width or thickness W in the direction in which a drive electric field is applied by a pair of electrodes 142, and a length L in a direction perpendicular to the polarized direction and the direction of the drive electric field. When the applied drive electric field is directed rightwardly in FIG. 11(*a*), the wall 140 is elastically deformed under thickness shear effect in the leftward direction as shown by a broken line T. When the volume of the ink passage 104 is varied by the shearing deformation, the change in the volume is proportional to the length L and the square of the height H provided the width W and the applied voltage are constant. Therefore, it is more effective to increase the change in the volume of the ink passage 104 by increasing the height H.

FIG. 11(*b*) is a plan view showing the wall 140 fixed, at its opposite ends 144 in the direction L, to horizontal base boards 143. The array 101 of the ink droplet ejecting device has the illustrated structure in an actual application. When the drive electric field is applied, the wall 140 is elastically deformed with its opposite ends 144 being fixed, as indicated by the dotted lines T1. To bend the wall 140 with its opposite ends 144 being fixed, there is required an energy or drive voltage which is greater due to stresses acting on the wall 140 than with the wall 140 with its longitudinal ends being free. The extra drive voltage is smaller as the ratio L/W is larger. According to calculations, it has been confirmed that, in order to achieve a certain volumetric change with the opposite ends 144 being fixed, the required drive voltage is several hundreds times greater, when L/W=1, than a case where the end portions of the wall are free. Further, the required drive voltage in case of the end-fixed wall is several tens times greater, when L/W=2, than the case of the wall with the free longitudinal ends, and the required drive voltage in case of the ends fixed-wall is from several to ten times greater, when L/W=3, than the free wall.

Consequently, the ratio L/W is required to be at least 3. On the other hand, if the ratio L/W were too large, however, it would be necessary for the piezoelectric ceramic panels 102, 103 to have very slender side walls 105, 107 in their longitudinal direction (see FIG. 10(*a*)). Mechanical strength and reliability of the piezoelectric ceramic panels 102, 103 would be greatly reduced as a result of injection molding or if the panel is subjected to machining such as drilling for forming holes. Further, such panel may lower the mechanical strength and reliability when it is driven by a drive electric field. For this reason, the ratio L/W should preferably be in the range of L/W≦10. Therefore, in order to allow the wall 140 to be elastically deformed under shearing stress in the transverse direction, the height H of the wall 140 in the polarized direction may be largest, and the ratio L/W of the length L of the wall 140 in the direction perpendicular to the polarized direction and the transverse direction, to the width W of the wall 140 may be 3 or more.

The array 101 of the ink droplet ejecting device according to this embodiment has four side walls 105, 107 surrounding one ink passage 104. Each of the side walls 105, 107 has a height H of 1.5 mm, a length L of 1.0 mm, and a width W of 0.25 mm. Since H is largest and L/W is 4 in the dimensional relations, the above conditions are satisfied. The drive voltage applied to eject about 90 pl of ink droplets was 43V.

Arrays according to comparative examples had a fixed height H, a fixed width W, a fixed pitch between adjacent orifices 110 in the array direction, and different lengths L which make the ratio L/W vary from 2.6 to 3.6. Drive voltages required to drive these comparative arrays were 373 V (L/W=2.6), 275V (L/W=2.8), 182V (L/W=3), 132V (L/W =3.2), 97V (L/W=3.4), and 73V (L/W=3.6). Those arrays with the ratio L/W smaller than 3 were required to be driven by voltages in excess of 200V, and were not practical in use.

The fixed orifice pitch indicates that the array according to the second embodiment of the invention can be driven with a low voltage without lowering the printing resolution, and the length L of the side walls 105, 107 perpendicular to the array direction can be minimized by increasing the height H in the polarized direction.

With the piezoelectric ink droplet ejecting device according to the second embodiment, a piezoelectric transducer for actuating the eight ink ejectors 134 is composed of two piezoelectric ceramic panels 102, 103, with a resultant simplified structure for the array 101. The piezoelectric ink droplet ejecting device can be manufactured in a relatively small number of steps and with a relatively low cost by employing the array 101 or a combination of arrays 101 similar to the first embodiment.

Further, it is possible to increase the number of ink ejectors 134, reduce the size of the array 101, increase the resolution of printed data, and lower the drive voltage by using a number of closely positioned through holes or ink passages 104 in the piezoelectric ceramic panels 102, 103.

For example, an array 101 having sixty-four (64) ink passages 104, which are of the same dimensions and spaced at the same center-to-center distance as those of the second embodiment, in a matrix of 2 (vertical)×32-(horizontal), may have outer dimensions of 2.2 mm×16.2 mm×5 mm or smaller.

Further, since the configuration of a side wall is optimized to satisfy the conditions H≧L and L/W≧3 where H is the height of the side wall in the polarized direction, W the width of the side wall, and L the length perpendicular to the polarized direction and the widthwise direction, about 90 pl of ink droplets can be ejected with a low drive voltage of 43V without reducing the mechanical strength and reliability of the side wall and also the printing resolution. This available drive voltage level is extremely smaller than a conventional drive voltage ranging from about 120 to 170V.

While each of the ink passages is of a rectangular cross section in the second embodiment, it may be of an oval-shaped cross-section with round shorter sides. Such ink passages of oval-shaped cross-section can easily be formed by an injection molding or mechanical machining process, and are highly reliable because only a low stress concentration is applied when driving.

Thus, in the second embodiment, the passage is defined such that the dimensions of a side wall between adjacent ink passages are selected to satisfy conditions H≧L and L/W≧3 where H is the height of the side wall in the polarized direction, W the width of the side wall, and L the length perpendicular to the polarized direction and the widthwise direction. Consequently, there is provided an ink droplet ejecting device which is capable of printing data with good resolution, whose ink passages can be formed with ease, and which can be driven with a low drive voltage.

With the second embodiment, each of the ink passages is defined in the shape of a rectangular parallelepiped parallel to the polarized direction, and each of the side walls of the piezoelectric transducer which is positioned between adjacent ink passages has a depth H in the polarized direction, a width W in the direction of the drive electric field, and a length L in a direction perpendicular to the polarized direction and the direction of the drive electric field. Since the depth H≧the length L, the ink can be ejected in a fixed direction. Since the width W is small, printing resolution is now lowered. Since the length L/the width W≧3, the side wall can be elastically deformed into the cross-sectional shape of a chevron, resulting in a relatively large change in the volume of the ink passage. For example, a drive voltage required to eject about 90 pl of ink droplets when L/W=4 is 43V. Therefore, a large amount of ink droplets can be ejected with a low practical voltage.

A piezoelectric ink droplet ejecting device according to a third embodiment will next be described with reference to FIGS. 12(*a*) through 14(*b*). The third embodiment is similar to the second embodiment in terms of consideration in the deformation of the side wall in connection with FIGS. 11(*a*) and 11(*b*).

Figure 12A:
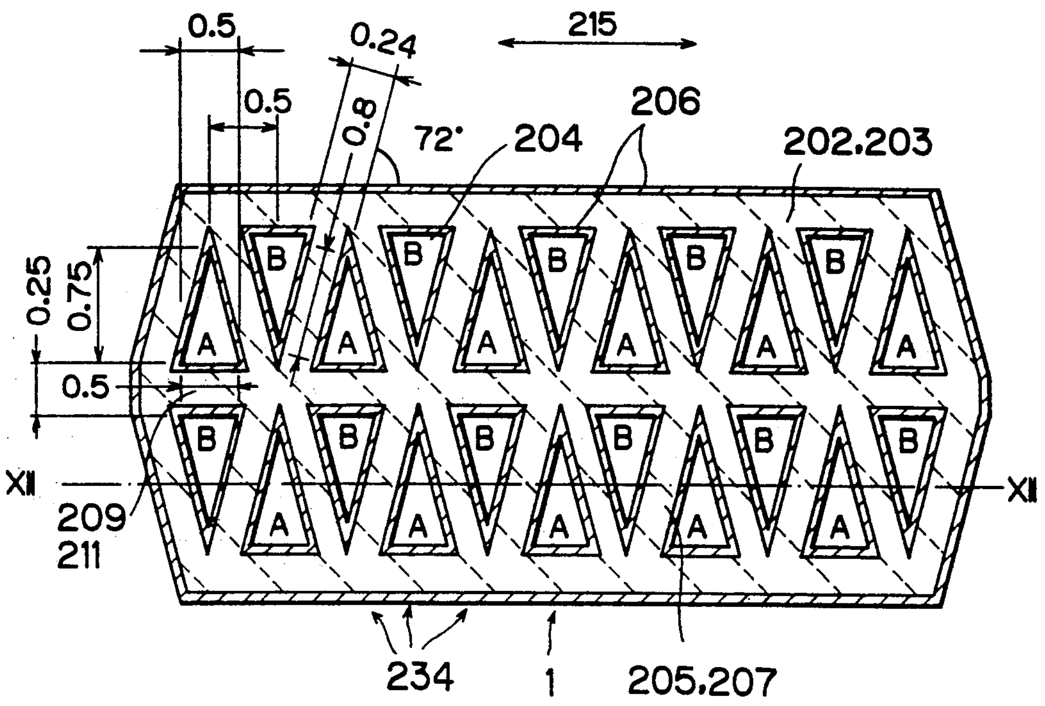
FIG. 12(*a*) is a cross-sectional view showing an array for use in a piezoelectric ink droplet ejecting device according to a third embodiment of this invention.
Figure 12B:
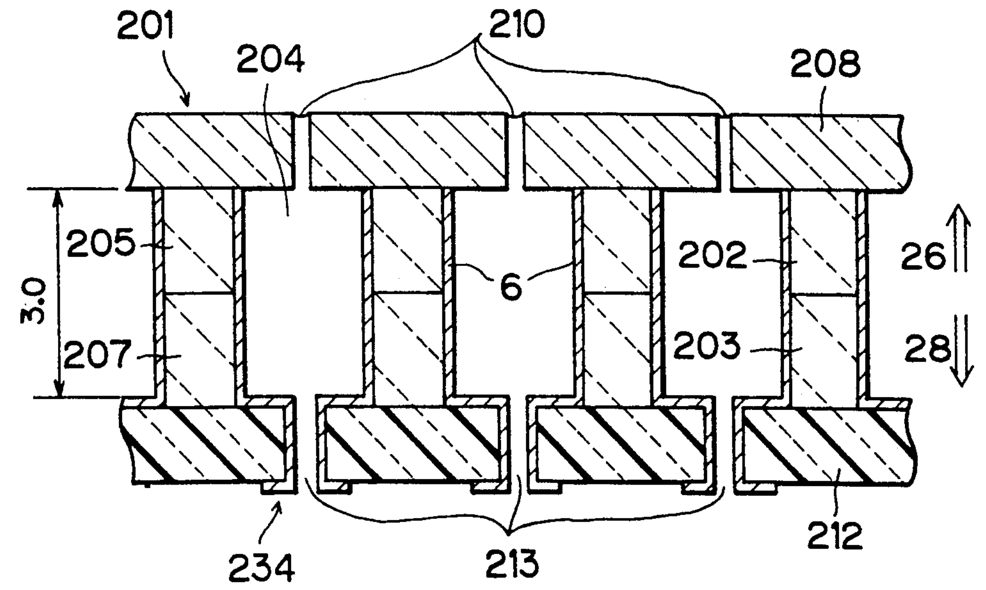

As shown in FIGS. 12(*a*) and 12(*b*), the array 201 includes an upper piezoelectric ceramic panel 202 and a lower, piezoelectric ceramic panel 203 which are bonded to each other. The upper piezoelectric ceramic panel 202 is polarized in the direction indicated by an arrow 26 and has through holes which are of a cross-section in the shape of an isosceles triangle having a height of 0.75 mm and a base of 0.5 mm and which have respective centers spaced by a distance of 0.5 mm. The through holes are arranged in a matrix of 2 horizontal rows×11 vertical columns with adjacent through holes turned upside down relatively to each other. The upper piezoelectric ceramic panel 202 has a thickness of 1.5 mm.

The lower piezoelectric ceramic panel 203 is polarized in the direction indicated by an arrow 28 and has through holes which are of a cross-section in the shape of an isosceles triangle having a height of 0.75 mm and a base of 0.5 mm and which have respective centers spaced by a distance of 0.5 mm. The through holes are arranged in a matrix of 2 horizontal rows×11 vertical columns with adjacent through holes turned upside down relatively to each other. The lower piezoelectric ceramic panel 202 has a thickness of 1.5 mm.

The through holes serve as ink passages 204 each having a length of 3.0 mm. The piezoelectric ceramic panels 202, 203 have side walls 205, 207 which divide the ink passages 204 in the array direction 215. Each of the side walls 205, 207 is inclined at an angle of about 72 degrees with respect to the array direction 215, has a width of about 0.24 mm, and a length of about 0.8 mm. The piezoelectric ceramic panels 202, 203 also have side walls 209, 211 extending parallel to the array direction 215 and having a width of 0.25 mm and a length of 0.5 mm. The array 201 thus constitutes a piezoelectric ink droplet ejecting device having twenty-two (22) ink ejectors 234.

Figure 13A:
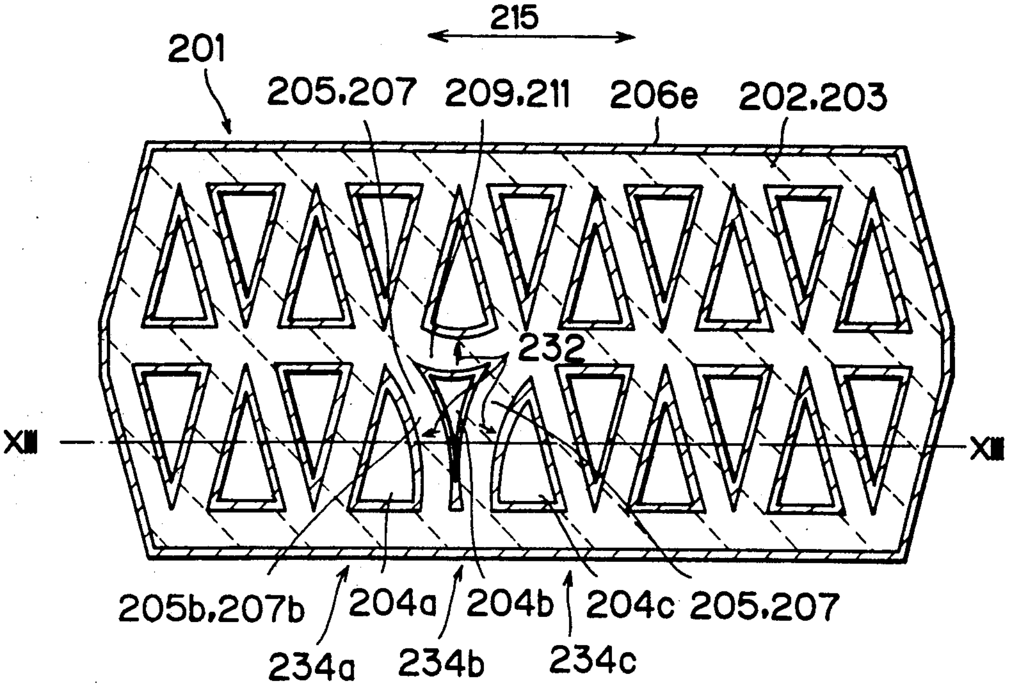
FIG. 13(*a*) is a view showing the array with an electric circuit connected thereto according to the third embodiment of this invention.
Figure 13B:
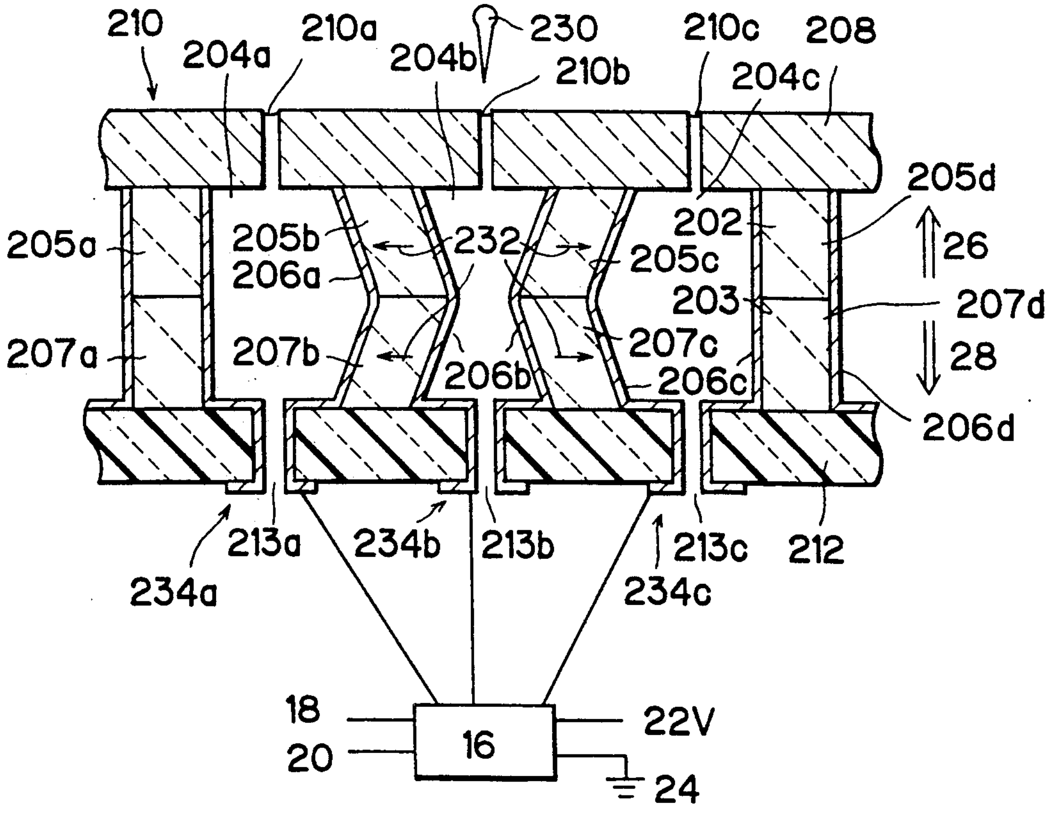

FIGS. 13(*a*) and 13(*b*) show electrical connection and deformation of the ink passages. Electrical connection, principles of the deformation and operation mode are the same as those of the foregoing embodiments, and therefore, further description is negligible. In the FIGURES, the ink passage 204*b* is to be operated, so that side walls 205, 207, 209, 211 surrounding the ink passage 204*b* are deformed because of the above described thickness shear effect.

Turning back to FIGS. 11(*a*) and 11(*b*), the ratio L/W is required to be at least 3 as described above. In this case, If the piezoelectric ceramic panels 202, 203 had very slender side walls 205, 207, 209, 211 (see FIG. 13(*a*) and 13(*b*)) in their direction of L so as to increase the ratio L/W, and if the side walls had increased length along the height H , then the mechanical strength and reliability of the piezoelectric ceramic panels 202, 203 would be greatly reduced in case of the injection-molding phase, machining phase for drilling holes, or actual driving phase by a drive electric field. Further with such an arrangement, the pitch of the orifices 210 and the outer dimension of the array 201 in the direction perpendicular to the array direction 215 would be increased. The above problem can be avoided in the third embodiment by not providing side walls which would be perpendicular to the array direction 215 as shown in FIG. 12(*a*).

More specifically, as shown in FIG. 12(*a*), the side walls 205, 207 are arranged to extend in the polarized directions 26, 28 (FIG. 12(*b*)) and also to extend in directions perpendicular to the polarized directions 26, 28 similar to the foregoing embodiments. Further, the side walls 205, 207 extend at an angle of about 72 degrees with respect to the array direction 215(FIG. 12(*a*)). Furthermore, other side walls 209, 211 are arranged to extend in the polarized directions 26, 28 and in a direction perpendicular to the polarized directions 26, 28 and also in the array direction 215.

This arrangement results in a highly rigid structure and is effective to prevent the mechanical strength and the reliability from being lowered when injection-molded, mechanically drilled to form holes, or driven by a drive electric field. Since the height of the side walls 205, 207 may be sufficiently large, the drive voltage can be lowered without having to unduly increase the length L of the side walls 205, 207, 209, 211. Because the side walls 205, 207 extend at an angle of about 72 degrees with respect to the array direction 215, the pitch between the orifices 210 in the array direction 215 and the outer dimension of the array 201 perpendicular to the array direction 215 may be reduced to about 94% of those of the side walls of the same dimensions which would extend perpendicularly to the array direction 215.

For example, the array 201 according to this embodiment constitutes a multiorifice head having twenty-two (22) ink injectors 234, in a small size having a horizontal width 6 mm, a vertical height of 2.75 mm, and a thickness of 3 mm. The array 201 according to the third embodiment has six (6) side walls 205, 207, 209, 211 surrounding a single ink passage 204. These side walls are dimensioned to satisfy the conditions that H is largest and $L/W \geqq 3$ such that each of the side walls 205, 207 has a height H of 1.5 mm, a width W of about 0.24 mm, and a length L of about 0.8 mm. Each of the side walls 209, 211 extending parallel to the array direction 215 has a height H of 1.5 mm, a width W of 0.25 mm, and a length L of 0.5 mm. With this arrangement, about 90 pl of ink droplets can be ejected by the array 201 with a low drive voltage of 35V. The piezoelectric ink droplet ejecting device according to the third embodiment can be driven with a low drive voltage which is much lower than the conventional drive voltage ranging from about 120 to 170V.

Figure 14A:
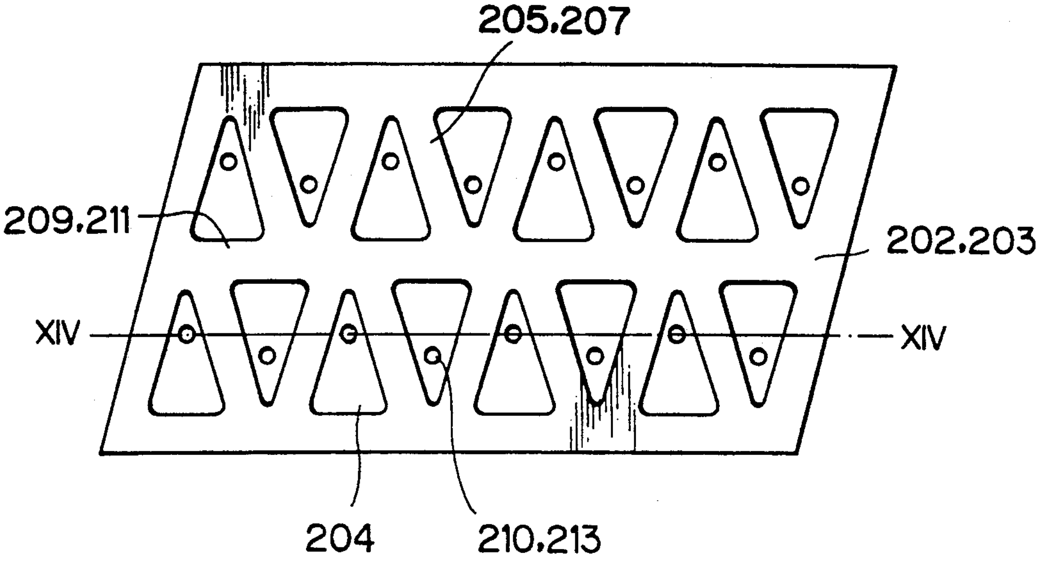
FIG. 14(*a*) is a plan view showing an array of a piezoelectric ink droplet ejecting devices according to one modification to the third embodiment of the present invention.
Figure 14B:
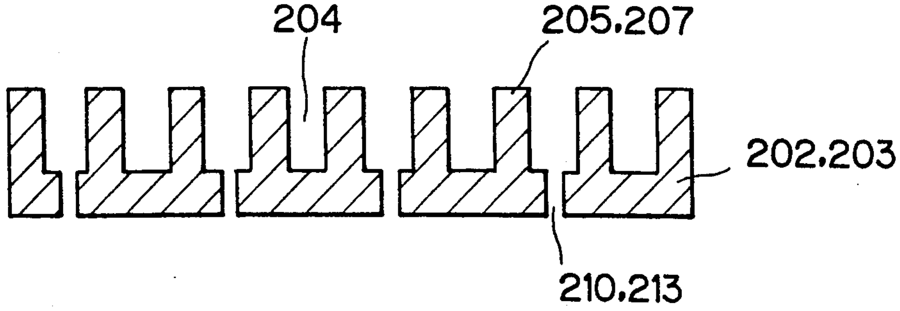

While each of the ink passages is of a cross-section in the shape of an isosceles triangle in the depicted third embodiment, it may be of a trapezoidal cross-section with round shorter sides. Further, as shown in FIG. 14(*a*), ink passages may have round corners. Such ink passages with round corners can easily be formed by an injection molding or mechanical machining process, and are highly reliable because the applied stress concentration is low when driving.

The through holes serving as ink passages may not necessarily be of a uniform inside diameter, but each of them may have different-diameter portions including a smaller-diameter portion as an orifice 210 and an ink supply passage 213 and a larger-diameter portion as an ink passage 204, as shown in FIG. 14(*b*). Such a modification is of a simpler structure.

According to the third embodiment of the invention, as described above, inasmuch as side walls confronting each other and defining the ink passage have intersecting extensions, it is possible to maintain a side wall width capable of elastically deforming the side wall into the shape of a chevron. The drive voltage required may be lowered by selecting the ratio L/W to be 3 or more.

With the third embodiment, the ink passage has a cross-section in the shape of an isosceles triangle, those side walls which confront each other across the ink passage have intersecting extensions. Such an arrangement is effective to lower a drive voltage because the ratio L/W is 3 or greater. Since the side walls are inclined at an angle of 72 degrees, for example, to the array direction, it is possible to maintain a side wall width W required to elastically deform the side wall into the shape of a chevron, and also to lower the outer dimension in the array direction (in which the drive voltage is applied.

Lastly, a method for fabricating the array 1, 101, 201 according to the foregoing embodiments will be described with reference to FIGS. 15(*a*) through 17(*b*). The fabrication steps are common to these embodiments.

Figure 15A:
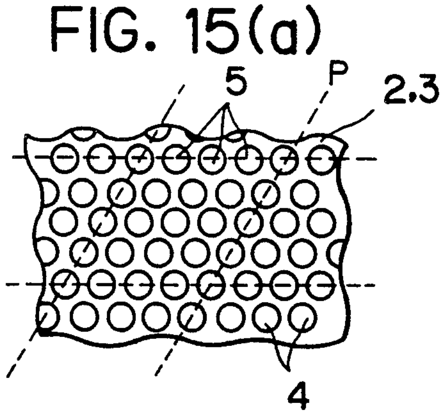
FIG. 15(*a*) is a plan view showing a piezoelectric ceramic panel in the first embodiment.
Figure 15B:
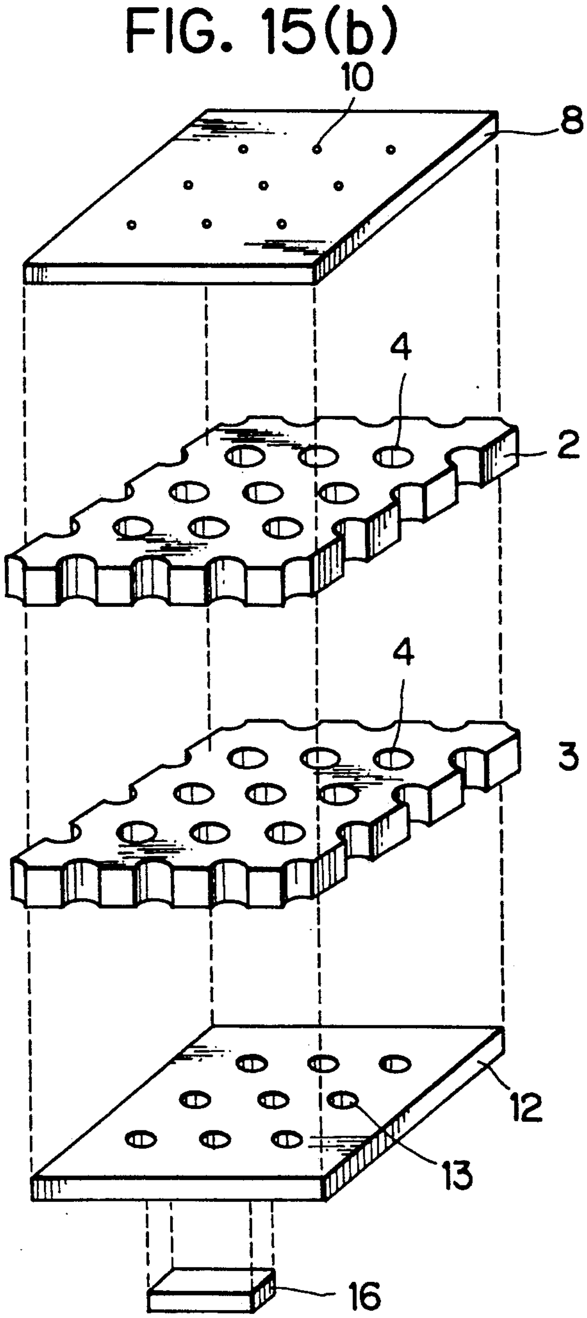
Figure 16A:
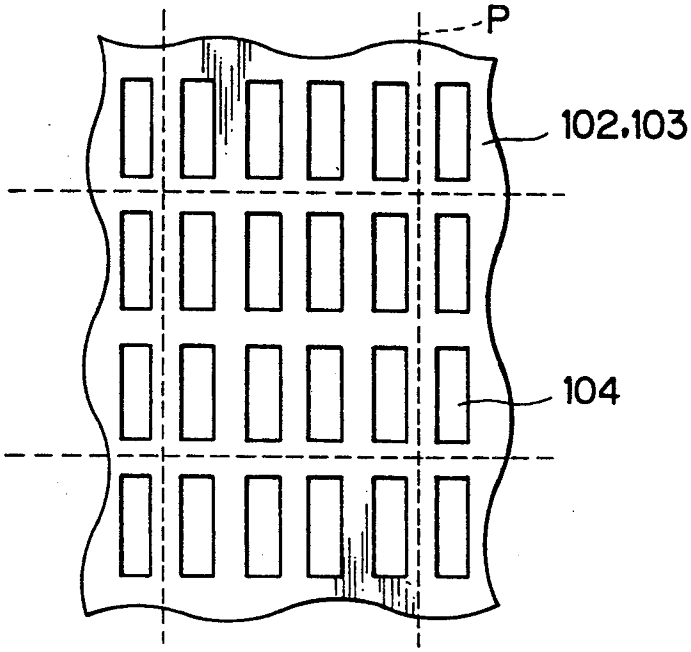
FIG. 16(*a*) is a plan view showing a piezoelectric ceramic panel in the second embodiment.

First, as shown in FIGS. 15(*a*), 16(*a*), and 17(*a*), piezoelectric ceramic panel blanks having through holes which will serve as the ink passages 4, 104, 204 are prepared by injection-molding. The blank material is formed of a ferroelectric ceramic material such as lead zirconate titanate (PZT). Then, the piezoelectric ceramic panel blanks are degreased, baked, polarized in the transverse direction (thickness direction) thereof. The panel is then plated with copper or nickel by electroless plating to form electrodes thereon, and processed to insulate the electrodes. Thereafter, the piezoelectric ceramic panel blanks are cut off along broken lines P passing through the centers of the through holes in the first embodiment shown in FIG. 15(*b*), or cut off along broken lines P as shown in FIGS. 16(*a*) and 17(*a*) in the second and the third embodiments. Then, upper and lower surfaces of the panel are treated to remove any excessive electrode layers and for a more planar surface finish. The piezoelectric ceramic panel blanks may be extrusion-molded, or through holes may be mechanically drilled in baked piezoelectric ceramic panels.

Figure 16B:
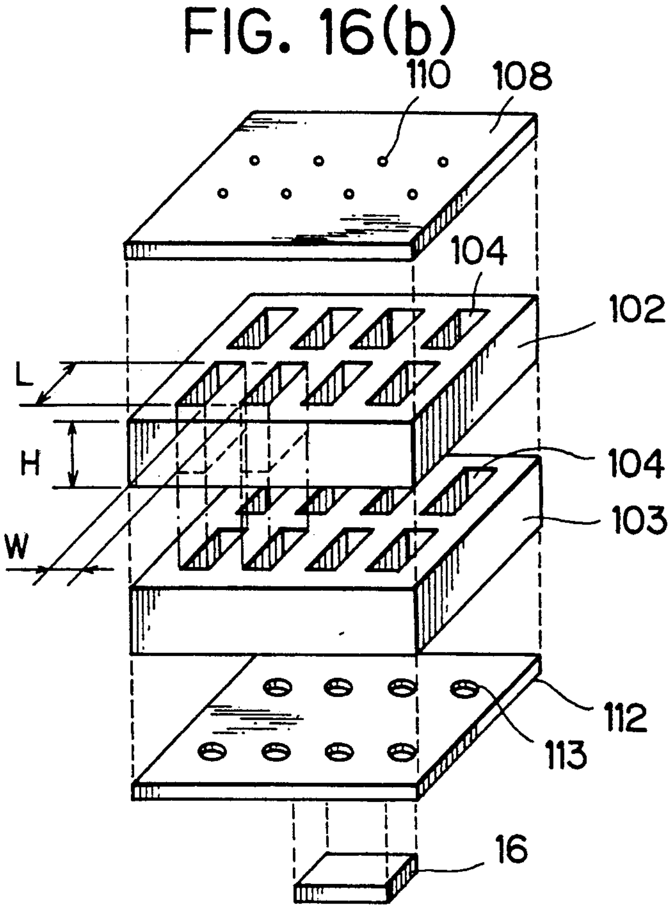
Figure 17A:
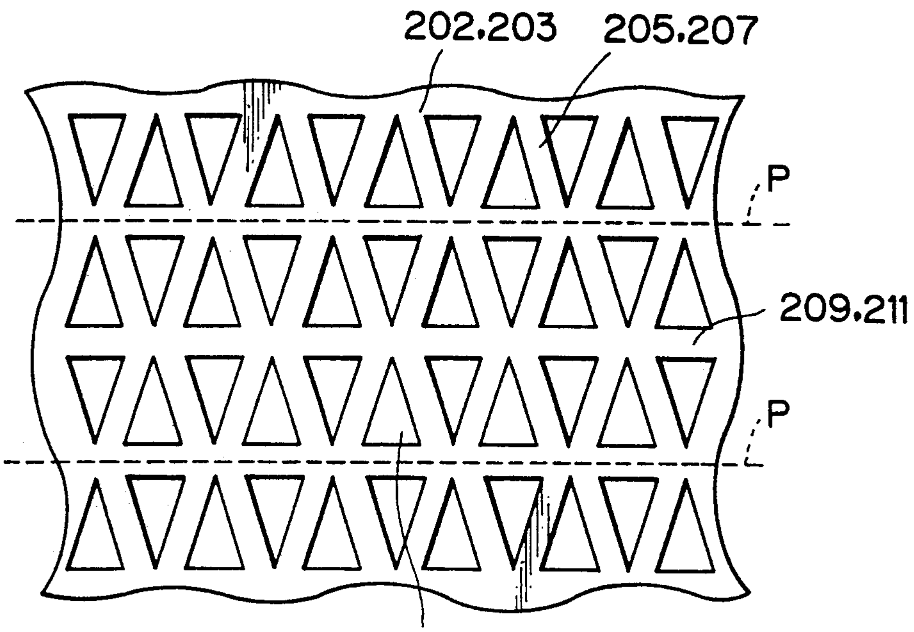
FIG. 17(*a*) is a plan view showing a piezoelectric ceramic panel in the third embodiment.
Figure 17B:
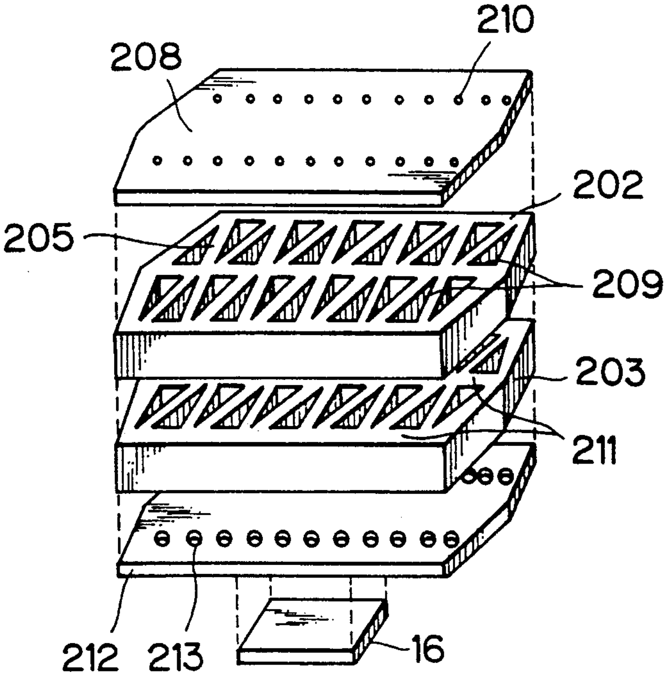

The electrodes may be formed by sputtering copper or nickel to provide the piezoelectric ceramic panels 2, 3, 102, 103, 202, 203. At this time, the axes of the holes and a parallel beam of metal atoms may be inclined to each other for the deposition of electrodes on the inner surfaces of the holes. Then, the orifice plate 8, 108, 208 with the orifices corresponding to the respective ink passages 4, 104, 204 and the bottom plate 12, 112, 212 with the ink supply passages 13, 113, 213 corresponding to the respective ink passages 4, 104, 204 are joined to the upper and lower piezoelectric ceramic panels 2, 3, 102, 103, 202, 203 at a temperature sufficiently lower than the Curie temperature of the upper and lower piezoelectric ceramic panels 2, 3, 102, 103, 202, 203 so as not to reduce the polarization of the upper and lower piezoelectric ceramic panels. The bottom plate 12, 112, 212 has on its lower surface a wiring for electrically connecting the electrodes in the ink passages to a driver LSI chip 16, as shown in FIGS. 15(b), 16(b), and 17(b). Then, the driver LSI chip 16 is mounted. In this manner, the array 1, 101, 201 can be manufactured.

While the invention has been described in detail and with reference to specific embodiments thereof, it would be apparent to those skilled in the art that various changes and modifications may be made therein without departing from the spirit and scope of the invention.

What is claimed is:

1. A piezoelectric ink droplet ejecting device having a plurality of ink ejectors each composed of a piezoelectric transducer for varying a volume of an ink passage to eject ink out of the ink passage, the device comprising:

the piezoelectric transducer made of a piezoelectric material and polarized in a longitudinal direction, the piezoelectric transducer being formed with a plurality of the ink passages extending longitudinally therethrough in a direction parallel to the polarized direction, the piezoelectric transducer being elastically deformable to vary the volume of the ink passages to eject ink stored therein in response to a drive electric field applied perpendicularly to the polarized direction in each of the ink passages.

2. The piezoelectric ink droplet ejecting device as claimed in claim 1, wherein the piezoelectric transducer comprises a pair of upper and lower piezoelectric ceramic panels bonded together, the upper piezoelectric ceramic panel being polarized in a first direction along the polarizing direction and being formed with through holes for serving as the ink passages, and the lower piezoelectric ceramic panel being polarized in a second direction opposite the first direction along the polarizing direction and being formed with through holes contiguous with the through holes of the first panel for serving as the ink passages.

3. The piezoelectric ink droplet ejecting device as claimed in claim 1, wherein the piezoelectric transducer has side walls defined between the ink passages adjacent with each other, each of the side walls being dimensioned to satisfy the relationships $H \geqq L$ and $L/W \geqq 3$ where W is the width of the side wall in a direction of the drive electric field, L the length of the side wall, and H the depth of the side wall in the polarized direction.

4. The piezoelectric ink droplet ejecting device as claimed in claim 1, wherein the piezoelectric transducer has side walls defined between the ink passages adjacent to each other, the side walls being inclined to an array direction such that those side walls which confront each other in the array direction intersect with each other.

5. The piezoelectric ink droplet ejecting device as claimed in claim 1, wherein the plurality of ink passages are formed in a two-dimensional array in the piezoelectric transducer.

6. The piezoelectric ink droplet ejecting device as claimed in claim 2, wherein the ejector further comprises:

an orifice plate joined to an upper surface of the upper piezoelectric ceramic panel, the orifice plate being formed with a plurality of ink orifices in communication with the through holes; and a bottom plate joined to a lower surface of the lower piezoelectric ceramic panel, the bottom plate being formed with a plurality of ink supply passages in communication with the through holes.

7. The piezoelectric ink droplet ejecting device as claimed in claim 2, wherein the through holes have circular cross-section, and are arranged in a geometrical pattern having symmetric hexad axes.

8. The piezoelectric ink droplet ejecting device as claimed in claim 2, wherein the through holes have hexagonal cross-section, and are arranged in a geometrical pattern having symmetric hexad axes.

9. The piezoelectric ink droplet ejecting device as claimed in claim 2, wherein the through holes have circular cross-section, and are arranged in a geometrical pattern having symmetric tetrad axes.

10. The piezoelectric ink droplet ejecting device as claimed in claim 3, wherein the piezoelectric transducer comprises a pair of upper and lower piezoelectric ceramic panels bonded together, the upper piezoelectric ceramic panel being polarized in a first direction along the polarizing direction and being formed with through holes for serving as the ink passages, and the lower piezoelectric ceramic panel being polarized in a second direction opposite the first direction along the poralizing direction and being formed with through holes contiguous with the through holes of the first panel for serving as the ink passages.

11. The piezoelectric ink droplet ejecting device as claimed in claim 3, wherein the ejector further comprises:

an orifice plate joined to an upper surface of the upper piezoelectric ceramic panel, the orifice plate being formed with a plurality of ink orifices in communication with the through holes; and a bottom plate joined to a lower surface of the lower piezoelectric ceramic panel, the bottom plate being formed with a plurality of ink supply passages in communication with the through holes.

12. The piezoelectric ink droplet ejecting device as claimed in claim 3, wherein the through holes have rectangular cross-section, and are arranged in two horizontal rows and four vertical columns for providing eight ejectors.

13. The piezoelectric ink droplet ejecting device as claimed in claim 3, wherein the side walls are inclined to an array direction such that those side walls which confront each other in the array direction intersect with each other.

14. The piezoelectric ink droplet ejecting device as claimed in claim 4, wherein the through holes has isosceles triangle cross-section for providing the side walls intersecting with each other, and for providing other side walls extending in the array direction.

15. The piezoelectric ink droplet ejecting device as claimed in claim 14, wherein neighboring isosceles triangular through holes are oriented reversely by 180 degrees.

16. The piezoelectric ink droplet ejecting device as claimed in claim 15, wherein the through holes are arranged in a matrix of two horizontal rows and eleven vertical columns for providing twenty-two ink passages.

17. The piezoelectric ink droplet ejecting device as claimed in claim 16, wherein each corner of the isosceles triangular through hole is rounded in shape.

* * * * *